United States Patent
Kobayashi et al.

(10) Patent No.: US 7,148,740 B2
(45) Date of Patent: Dec. 12, 2006

(54) BOOST CIRCUIT AND SEMICONDUCTOR INTEGRATED CIRCUIT

(75) Inventors: Hironori Kobayashi, Nagano (JP); Hisashi Yamaguchi, Nagano (JP)

(73) Assignee: Seiko Epson Corporation (JP)

( * ) Notice: Subject to any disclaimer, the term of this patent is extended or adjusted under 35 U.S.C. 154(b) by 59 days.

(21) Appl. No.: 11/099,260

(22) Filed: Apr. 5, 2005

(65) Prior Publication Data

US 2005/0225377 A1 Oct. 13, 2005

(30) Foreign Application Priority Data

Apr. 8, 2004 (JP) ............................. 2004-113774

(51) Int. Cl.
  G05F 1/10 (2006.01)
  H02M 3/18 (2006.01)
(52) U.S. Cl. ....................................... 327/536; 363/60
(58) Field of Classification Search ................ 327/536, 327/589; 363/59–60
See application file for complete search history.

(56) References Cited

U.S. PATENT DOCUMENTS 6,160,723 A * 12/2000 Liu ............................. 363/60
6,952,129 B1 * 10/2005 Lin et al. ..................... 327/536
6,960,955 B1 * 11/2005 Nonaka ....................... 327/536
6,972,973 B1 * 12/2005 Abe et al. ..................... 363/60
2002/0130704 A1 * 9/2002 Myono et al. .............. 327/536
2005/0024126 A1 * 2/2005 Suwa et al. ................ 327/536

FOREIGN PATENT DOCUMENTS

JP  60-245464  12/1985

* cited by examiner

Primary Examiner—Quan Tra
Assistant Examiner—Rey J. Aranda
(74) Attorney, Agent, or Firm—Harness, Dickey & Pierce, P.L.C.

(57) ABSTRACT

A boost circuit includes: level shifters 3 and 4 for shifting a high level of a clock signal; a first boost means which contains transistors QP3 and QP4 for conducting switching in accordance with the clock signal whose high level has been shifted and capacitors C1 and C2 and, thereby, generates a power source potential $V_{DC}2$ by conducting a charge pump operation; level shifters 1 and 2 for shifting a high level of a clock signal; inverters IV41 to IV52 for shifting a low level of the clock signal whose high level has been shifted; and a second boost means which contains transistors QP1 and QP2 for conducting the switching in accordance with the clock signal whose high level and low level have been shifted and capacitors C3 and C4 and, thereby, generates a power source potential $V_{DC}3$ by conducting the charge pump operation.

6 Claims, 6 Drawing Sheets

BOOST CIRCUIT AND SEMICONDUCTOR INTEGRATED CIRCUIT

RELATED APPLICATIONS

This application claims priority to Japanese Patent Application No. 2004-113774 filed Apr. 8, 2004 which is hereby expressly incorporated by reference herein in its entirety.

BACKGROUND

1. Technical Field

The present invention relates to a boost circuit utilizing a metal oxide semiconductor field effect transistor (MOSFET). Further, the present invention relates to a semiconductor integrated circuit for realizing such a boost circuit.

2. Related Art

For an example, it is known to use a boost circuit employing a charge pump method which utilizes the MOSFET as a power source circuit of a thin-film transistor (TFT) driver IC for driving a liquid-crystal display. FIG. 6 shows a configuration of such a conventional boost circuit. This boost circuit includes: P-channel MOS transistors QP1 to QP3 that carry out the charge pump operation, capacitors C1 to C3 coupled with these transistors, a P-channel MOS transistor QP11 and an N-channel MOS transistor QN11 composing a first inverter IV1, a P-channel MOS transistor QP12 and an N-channel MOS transistor QN12 composing a second inverter IV2, level shifters 1 to 3 and inverters IV11 to IV73 for supplying gate voltages $V_G1$ to $V_G3$ respectively to the transistors QP1 to QP3.

By carrying out the charge pump operation with the supply of boost clock signals $V_{IN}1$ and $V_{IN}2$, this boost circuit generates a power source potential $V_{DC}3$ upon boosting a power source potential $V_{DC}1$. Here, for simplicity's sake, it is assumed that a power source potential $V_{SS}$ that becomes a reference potential is 0 volts (ground potential); the power source potential $V_{DC}1$ is V volts (e.g., 2.8 volts); and the power source potential $V_{DC}3$ is 3×V volts (e.g., 8.4 volts).

The charge pump operation is carried out when charging and discharging of the capacitors C1 and C2 are repeated by switching operations of the transistors QP1 to QP3 and by reversing operations of the first and the second inverters IV1 and IV2, accompanying potential movement. As a result, potential is charged from a drain or a source of the transistor QP1 to the capacitor C3, and the power source potential $V_{DC}3$ at one end of the capacitor C3 gradually rises to reach about three times the power source potential $V_{DC}1$ (3×V volts) in a steady state.

FIG. 7 illustrates a voltage waveform of each section of the conventional boost circuit shown in FIG. 6. FIG. 7 shows the voltage waveform after having reached the steady state. The boost clock signals $V_{IN}1$ and $V_{IN}2$, whose one phase being a reversed phase of the other, swing between V volts and 0 volts. By shifting high levels of the boost clock signals $V_{IN}1$ and $V_{IN}2$ by use of the level shifters 1 to 3, the gate voltages $V_G1$ to $V_G3$ that swing between 3×V volts and 0 volts are obtained. These gate voltages $V_G1$ to $V_G3$ are applied to the gates of the transistors QP1 to QP3 through the inverters IV61 to IV73, whereupon the transistors QP1 to QP3 carry out the switching operation. Consequently, potentials at both ends of the capacitor C1 (VP1 and VM1) and potentials at both ends of the capacitor C2 (VP2 and VM2) change as shown in FIG. 7.

Here, a maximum of 3×V volts (e.g. 8.4 volts) is applied to the gates of the transistors QP1 to QP3. If a maximum voltage between the gate and source of a middle-voltage transistor is around 2×V volts (e.g., 6 volts), however, the gate voltage exceeds this value, and a high-voltage transistor will have to be used. Also, drive capacity of the inverters IV61 to IV73 that drive the transistors QP1 to QP3 will have to be increased. However, the high-voltage transistor is larger in size than the middle-voltage transistor, which increases the substrate area if used as well as the size of the chip and results in high production cost. Further, if the size of the transistor becomes larger, the gate capacitance becomes larger, charging and discharging current as well as quiescent current increases, and a frequency feature of the boost clock signal becomes degraded.

As a related technique, Japanese Unexamined Patent Publication No. 60-245464 (pp. 1–2, FIG. 1) discloses a charge-pump-type boost circuit having good exchange efficiency and giving high output voltage. This boost circuit obtains boosted voltage by being provided with a first switching transistor and a second switching transistor connected in series between a first power source potential and a second power source potential, with a capacitor connected to the connection point of this connection in series, while the first and second switching transistors repeatedly shift from conductive to non-conductive by turns having the capacitor to charge and discharge. Further, a means for supplying a boosted output voltage to a base of the first switching transistor is also provided. However, with this boost circuit, charging and discharging of the capacitor are carried out by use of two diodes, giving the boosted voltage of only about twice the power source voltage.

Accordingly, in view of the issues described above, the present invention aims to provide a boost circuit with which a high voltage-boosting ratio can be obtained without using a large sized, high-voltage transistor.

SUMMARY

In order to solve the above-described problem, the boost circuit of the present invention includes: a first level shift means for shifting either a high level or a low level of a clock signal from the first power source potential to a second power source potential; a first boost means, which contains a plurality of transistors for conducting switching in accordance with the clock signal whose one level has been shifted by the first level shift means and a plurality of capacitors each coupled with the plurality of transistors, which generates the second power source potential having an absolute value larger than that of the first power source potential by conducting a charge pump operation, and which supplies the second power source potential to the first level shift means; a second level shift means for shifting either a high level or a low level of a clock signal from the first power source potential to a third power source potential; a third level shift means for shifting the other level of the clock signal whose one level has been shifted by the second level shift means from the reference potential to the second power source potential; and a second boost means, which contains a plurality of transistors for conducting switching in accordance with a clock signal whose high level and low level have been shifted by the second and the third level shift means and a plurality of capacitors each coupled with the plurality of transistors, which generates the third power source potential having an absolute value larger than that of a second power source potential by conducting a charge pump operation, and which supplies the third power source potential to the second and third level shift means.

Additionally, the first boost means may include: a first P-channel MOS transistor having a source or a drain coupled with the first power source potential; a second P-channel MOS transistor having a drain or a source coupled with a source or a drain of the first P-channel MOS transistor; a first inverter for inverting a first clock signal; a first capacitor coupled between a coupling node of the first and second P-channel MOS transistors and an output node of the first inverter; and a second capacitor coupled with the drain or the source of the second P-channel MOS transistor, holding the second power source potential.

Further, the first level shift means may include: a first level shifter for generating a gate voltage of the first P-channel MOS transistor by shifting a high level of a second clock signal whose phase is a reversed phase of a first clock signal; and a second level shifter for generating a gate voltage of the second P-channel transistor by shifting a high level of the first clock signal.

Moreover, the second boost means may include: a third P-channel transistor having a source or a drain coupled with the second power source potential; a fourth P-channel MOS transistor having a source or a drain coupled with a drain or a source of the third P-channel transistor; a second inverter for inverting the first clock signal; a third capacitor coupled between a coupling node of the third and fourth P-channel MOS transistors and the output node of the second inverter; and a fourth capacitor being coupled with the drain or the source of the fourth P-channel MOS transistor and holding the third power source potential.

Further, the second level shift means may include: a third level shifter for shifting a high level of the second clock signal and a fourth level shifter for shifting a high level of the first clock signal, wherein the third level shift means contains: a first slice circuit for generating a gate voltage of the third P-channel MOS transistor by shifting a low level of the second clock signal whose high level has been shifted by the third level shifter, and a second slice circuit for generating a gate voltage of the fourth P-channel MOS transistor by shifting the low level of the first clock signal whose high level has been shifted by the fourth level shifter.

Furthermore, a semiconductor integrated circuit of the present invention includes: a first level shift means for shifting either a high level or a low level of a clock signal from the first power source potential to a second power source potential; a first boost means, which contains a plurality of transistors for conducting switching in accordance with the clock signal whose one level has been shifted by the first level shift means, which generates the second power source potential having an absolute value larger than that of the first power source potential by conducting a charge pump operation while a plurality of capacitors are coupled with the plurality of transistors, and which supplies the second power source potential to the first level shift means; a second level shift means for shifting either a high level or a low level of the clock signal from the first power source potential to a third power source potential; a third level shift means for shifting the other level the clock signal whose one level has been shifted by the second level shift means from the reference potential to the second power source potential; and a second boost means, which contains a plurality of transistors for conducting switching in accordance with the clock signal whose high level and low level have been shifted by the second and the third level shift means, which generates the third power source potential having an absolute value larger than that of the second power source potential by conducting a charge pump operation while a plurality of capacitors are coupled with the plurality of transistors, and which supplies the third power source potential to the second and the third level shift means.

Effect of the Invention

The present invention can provide the boost circuit with which a high voltage-boosting ratio can be obtained without using a large sized, high-voltage transistor, by including: the first boost means for generating the second power source potential having an absolute value larger than that of the first power source potential by conducting the charge pump operation using the clock signal whose high level or low level has been shifted; and the second boost means for generating the third power source potential having an absolute value larger than that of the second power source potential by conducting the charge pump operation using the clock signal whose high level and low level have been shifted.

DETAILED DESCRIPTION

In the following, a preferred embodiment to implement the present invention will be described in detail with reference to the accompanying drawings. Note that the same reference numbers are allotted to the same composition elements, and that descriptions thereof will be omitted.

Figure 1:
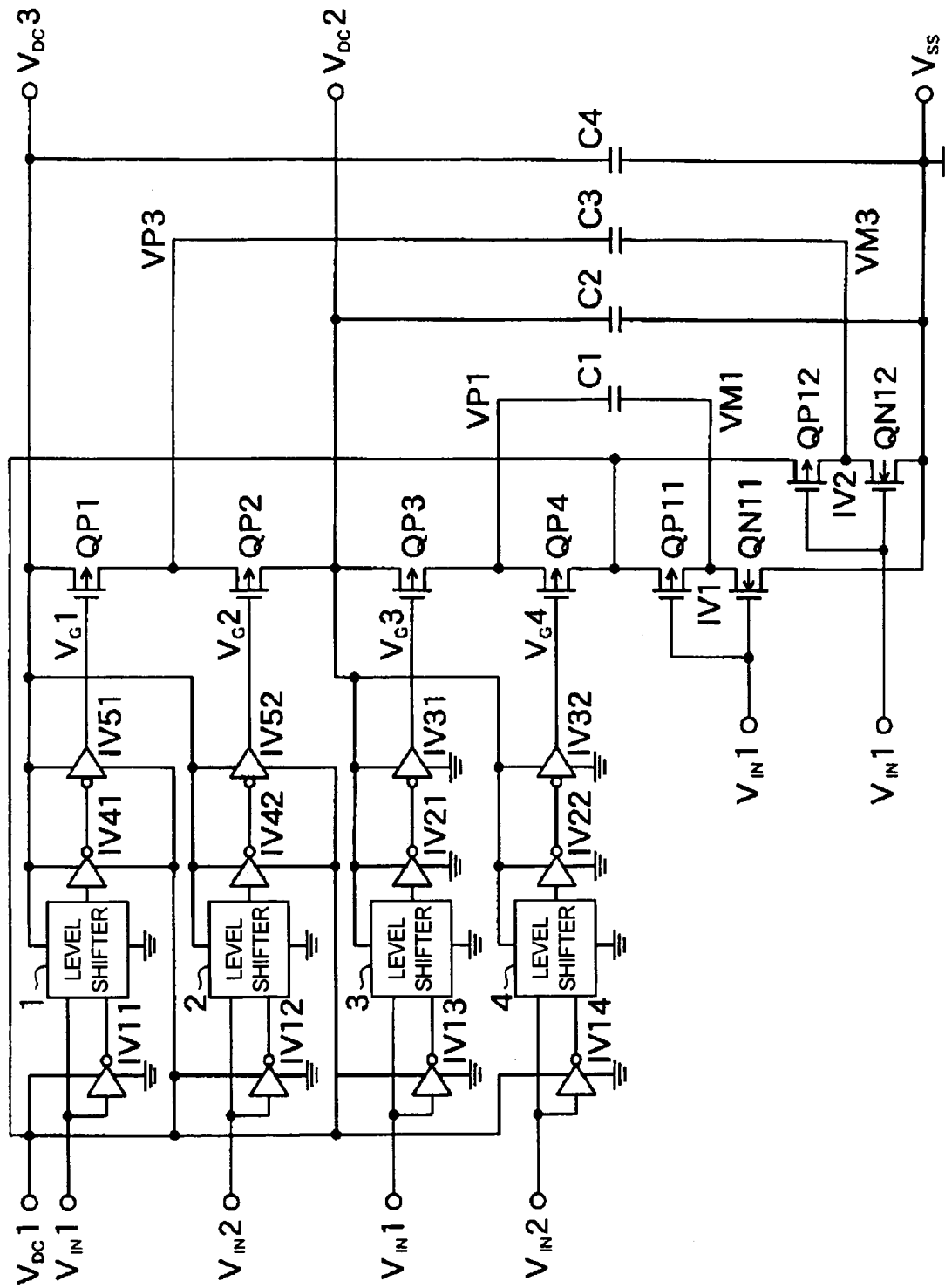
FIG. 1 is a diagram illustrating a configuration of a boost circuit according to one embodiment of the present invention.

FIG. 1 is a diagram illustrating a configuration of the boost circuit according to one embodiment of the present invention. This boost circuit includes: P-channel MOS transistors QP1 to QP4 to carry out the charge pump operation, capacitors C1 to C4 coupled with these transistors, a P-channel MOS transistor QP11 and an N-channel MOS transistor QN11 composing a first inverter IV1, a P-channel MOS transistor QP12 and an N-channel MOS transistor QN12 composing a second inverter IV2, level shifters 1 to 4 and inverters IV11 to IV52 for supplying gate voltages $V_G1$ to $V_G4$ respectively to the transistors QP1 to QP4.

Here, the first boost means includes: the transistor QP4 having the source or the drain that is coupled with the power source potential $V_{DC}1$, the transistor QP3 having the source or the drain that is coupled with the drain or the source of the transistor QP4, the first inverter IV1, the capacitor C1 coupled between the connecting node of the transistors QP3 and QP4 and the output node of the first inverter IV1, and the capacitor C2 coupled with the drain or the source of the transistor QP3 and holding the power source potential $V_{DC}2$.

Further, the second boost means includes: the transistor QP2 having the source or the drain that is coupled with the power source potential $V_{DC}2$, the transistor QP1 having the source or the drain that is coupled with the drain or the source of the transistor QP2, the second inverter IV2, the capacitor C3 coupled between the connecting node of the transistors QP1 and QP2 and the output node of the second inverter IV2, and the capacitor C1 coupled with the drain or the source of the transistor QP1 and holding the power source potential $V_{CD}3$.

By carrying out the charge pump operation with the supply of the boost clock signals $V_{IN}1$ and $V_{IN}2$, this boost circuit generates the power source potential $V_{DC}2$ as the first boost means boosts the power source potential $V_{DC}1$, and, further, this boost circuit generates the power source potential $V_{DC}3$ as the second boost means boosts the power source potential $V_{DC}2$. Here, for simplicity's sake, it is assumed that the power source potential $V_{SS}$ that becomes the reference potential is 0 volts (a ground potential); the power source potential $V_{DC}1$ is V volts (e.g., 2.8 volts); the power source potential $V_{DC}2$ is 2×V volts (e.g., 5.6 volts); and the power source potential $V_{DC}3$ is 3×V volts (e.g., 8.4 volts).

The level shifters 3 and 4 shift the high levels of the boost clock signals $V_{IN}1$ and $V_{IN}2$ that swing between the power source potential $V_{DC}1$ and the power source potential $V_{SS}$ from the power source potential $V_{DC}1$ to the power source potential $V_{DC}2$. Also, the level shifters 1 and 2 shift the high levels of the boost clock signals $V_{IN}1$ and $V_{IN}2$ that swing between the power source potential $V_{DC}1$ and the power source potential $V_{SS}$ from the power source potential $V_{DC}1$ to the power source potential $V_{DC}3$.

Figure 2:
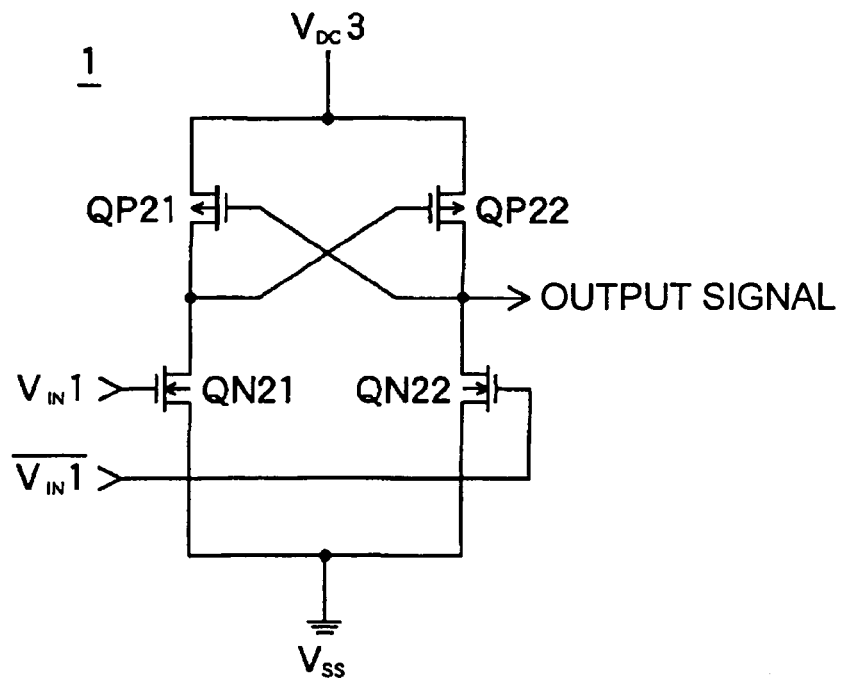
FIG. 2 is a diagram illustrating a circuit configuration of a level shifter according to one embodiment of the present invention.

FIG. 2 shows a configuration of the level shifter of the present embodiment. Although the level shifter 1 will be described here, other level shifters have the same configuration. However, note that the power source potential $V_{DC}3$ is supplied to the level shifters 1 and 2, and the power source potential $V_{DC}2$ is supplied to the level shifters 3 and 4.

As shown in FIG. 2, the level shifter 1 includes the P-channel transistors QP21 and QP22 and the N-channel transistors QN21 and QN22. The level shifter 1 generates an output signal that swings between the power source potential $V_{DC}3$ and the power source potential $V_{SS}$ based on the inputting boost clock signal $V_{IN}1$ and its inverted signal $V_{IN}1$ bar. With the level shifter 1, a voltage of 3×V volts (e.g., 8.4) is applied either between the gate and source or the gate and drain of the transistor. Therefore, if a maximum voltage between the gate and source of the middle-voltage transistor is around 2×V volts (e.g., 6 volts), a high-voltage transistor needs to be used.

Referring again to FIG. 1, the inverters IV11 to IV14 carry out common inversion operations as the power source potentials $V_{CD}1$ and $V_{SS}$ are supplied. For the inverters IV11 to IV14, the low-voltage transistors can be used. Further, the inverters IV21 and IV22 and IV31 and IV32 carry out common inversion operations as the power source potentials $V_{CD}2$ and $V_{SS}$ are supplied. For the inverters IV21 to IV32, the middle-voltage transistors can be used.

In contrast, the inverters IV41 and IV42 function as a level shift means for shifting the low level from the power source potential $V_{SS}$ to the power source potential $V_{DC}1$ as the power source potentials $V_{DC}3$ and $V_{DC}1$ are supplied and as the low level of the input signal, which swings between the power source potential $V_{DC}3$ and the power source potential $V_{SS}$, is sliced. With the inverters IV41 and IV42, a potential difference of 3×V volts (e.g., 8.4) is applied between either the gate and source or the gate and drain of the transistor. Therefore, if a maximum voltage between the gate and source of a middle-voltage transistor is around 2×V volts (e.g., 6 volts), a high-voltage transistor needs to be used. Further, the inverters IV51 and IV52 invert the outputs of the inverters IV41 and IV42, respectively.

FIG. 3 shows a configuration of the inverter of the present embodiment.

Figures 3A, 3B:
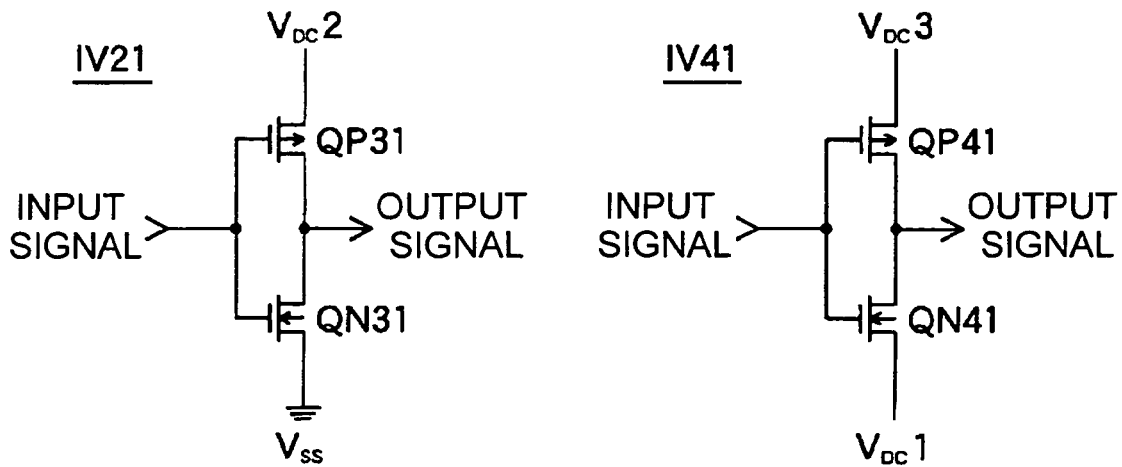
FIG. 3 is a diagram illustrating a circuit configuration of an inverter according to one embodiment of the present invention.

FIG. 3(a) shows a configuration of the inverter IV21. The inverter IV21 includes the P-channel transistor QP 31 and the N-channel transistor QN31 that are connected in series between the power source potential $V_{DC}2$ and the power source potential $V_{SS}$. The inverters IV22, IV31, and IV32 have the same configuration.

FIG. 3(b) shows a configuration of the inverter IV41. The inverter IV41 includes the P-channel transistor QP41 and the N-channel transistor QN 41 that are connected in series between the power source potential $V_{DC}3$ and the power source potential $V_{DC}1$. The inverters IV42, IV51, and IV52 have the same configuration.

Additionally, every section of the boost circuit shown in FIG. 1 except for the capacitors C1 to C4 can be integrated into a semiconductor integrated circuit. FIG. 4 is a cross-sectional diagram showing a partial structure of the semiconductor integrated circuit of one embodiment of the present invention.

Figure 4A:
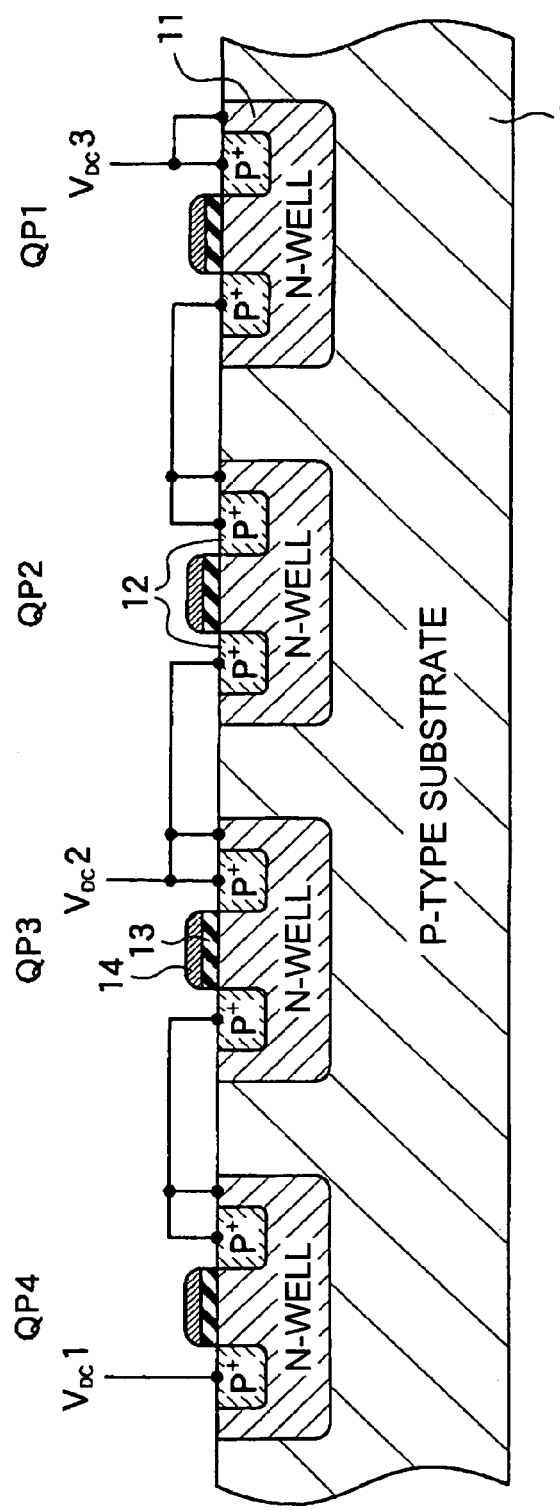
FIG. 4 is a cross-sectional diagram illustrating a partial structure of a semiconductor integrated circuit according to one embodiment of the present invention.

FIG. 4(a) shows a cross-sectional view of a section where the P-channel MOS transistors QP1 to QP4 that carry out the charge pump operations are formed. In a P-type semiconductor substrate 10, N-wells 11 are formed, and in each N-well 11, a P-type impurity diffusion region 12 that becomes either the source or the drain of the transistor is formed. Further, on the semiconductor substrate 10, a gate electrode 14 is formed with a gate insulating film 13 interposed therebetween. For the transistors QP1 to QP4, because the maximum voltage between the gate and source or the gate and drain is 2×V volts, the middle-voltage transistors can be used.

Figure 4B:
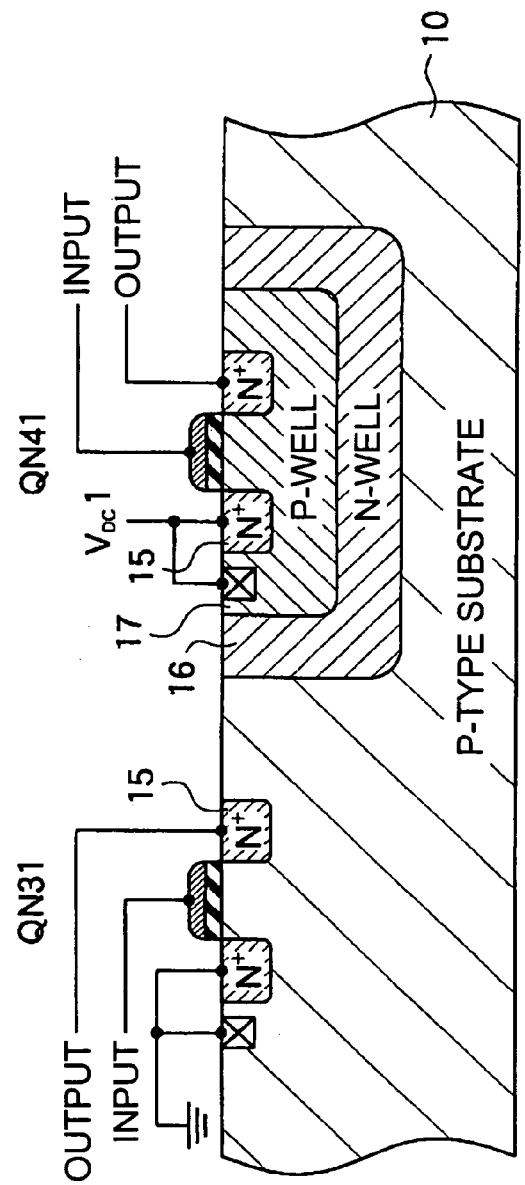

FIG. 4(b) shows a cross-sectional view of a section where the N-channel MOS transistor QN31 composing the inverter IV21 and the N-channel transistor QN41 composing the inverter IV41 are formed. With the middle-voltage transistor QN31, it is possible to form an N-type impurity diffusion region 15 that becomes either the source or the drain of the transistor directly inside the P-type semiconductor substrate 10. Additionally, to the P-type semiconductor substrate 10, the power source potential $V_{SS}$ (in the present embodiment, the ground potential) is applied. In contrast, with the transistor QN41, in order to obtain high voltage, an N-well 16 is formed inside the P-type semiconductor substrate 10; a P-well 17 is formed inside the N-well 16; and the N-type impurity diffusion region 15 that becomes the source or the drain of the transistor is formed inside the P-well 17. Additionally, the power source potential $V_{DC}1$ is applied to the P-well 17.

The charge pump operation is carried out when charging and discharging of the capacitors C1 and C3 are repeated by the switching operation of the transistors QP1 to QP4 and the reversing operation of the first and second inverters IV1 and IV2, which accompanies the movement of potential. As a result, potential is charged from the drain or the source of the transistor QP3 to the capacitor C2, and thereby the power source potential $V_{DC}2$ at one end of the capacitor C2 gradually rises to reach about twice the power source potential $V_{DC}1$ (2×V volts) in the steady state. Further, potential is charged from the drain or the source of the transistor QP1 to the capacitor C4, and thereby the power source potential $V_{DC}3$ at one end of the capacitor C4 gradually rises to reach about three times the power source potential $V_{DC}1$ (3×V volts) in the steady state.

Figure 5:
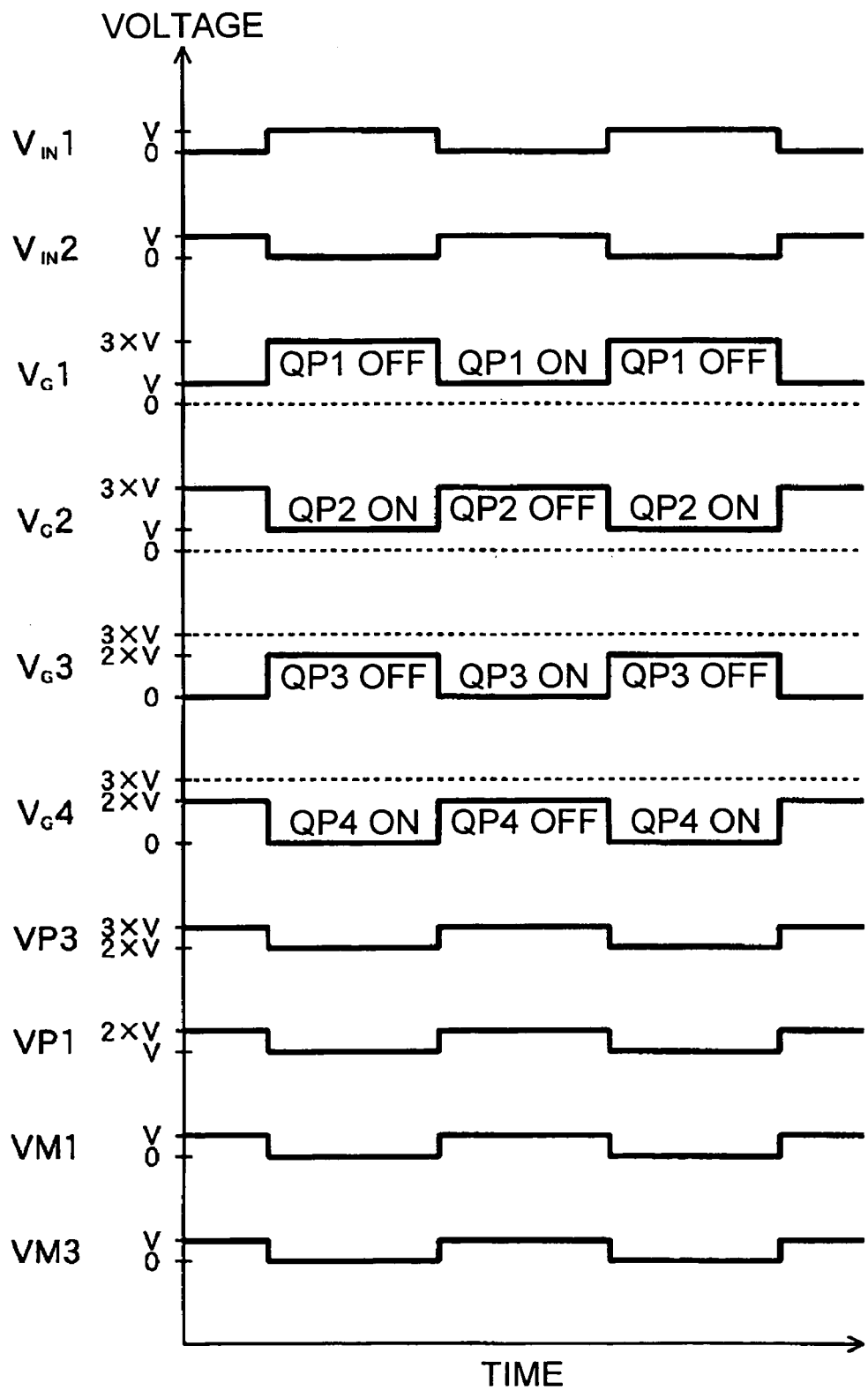
FIG. 5 is a diagram illustrating a waveform of each section of the boost circuit according to one embodiment of the present invention.

FIG. 5 shows a waveform of each section of the conventional boost circuit. FIG. 5 shows voltages after having reached the steady state. The boost clock signals $V_{IN}1$ and $V_{IN}2$, whose one phase being a reversed phase of the other, swing between V volts and 0 volts. By shifting the high levels of the boost clock signals $V_{IN}1$ and $V_{IN}2$ by use of the level shifters 3 and 4, the gate voltages $V_G3$ and $V_G4$ that swing between 2×V volts and 0 volts can be obtained. Further, after having shifted the high levels of the boost clock signals $V_{IN}1$ and $V_{IN}2$ by use of the level shifters 1 and 2, the gate voltages $V_G1$ and $V_G2$ that swing between 3×V volts and 0 volts can be obtained by shifting the low levels of the boost clock signals $V_{IN}1$ and $V_{IN}2$ using the inverters IV41 and IV42. Consequently, potentials at both ends of the capacitor C1 (VP1 and VM1) and potentials at both ends of the capacitor C3 (VP3 and VM3) change as shown in FIG. 5.

It is to be noted here that, while the maximum of 3×V volt gate voltage is applied to the gates of the transistors QP1 and QP2, the minimum gate voltage is not 0 volts but V volts and the source or drain voltage is 2×V to 3×V volts; therefore, the highest voltage between the gate and source or the gate and drain is not 3×V volts but 2×V volts (e.g., 5.6 volts). Further, the highest voltage between the gate and source or the gate and drain of the transistors QP3 and QP4 is also 2×V volts. Therefore, for the transistors QP1 to QP4 that carry out the charge pump operation, it is possible to use the middle-voltage transistor with the maximum voltage of around 2×V volts (e.g., 6 volts) instead of using the large-sized, high-voltage transistor.

Figure 6:
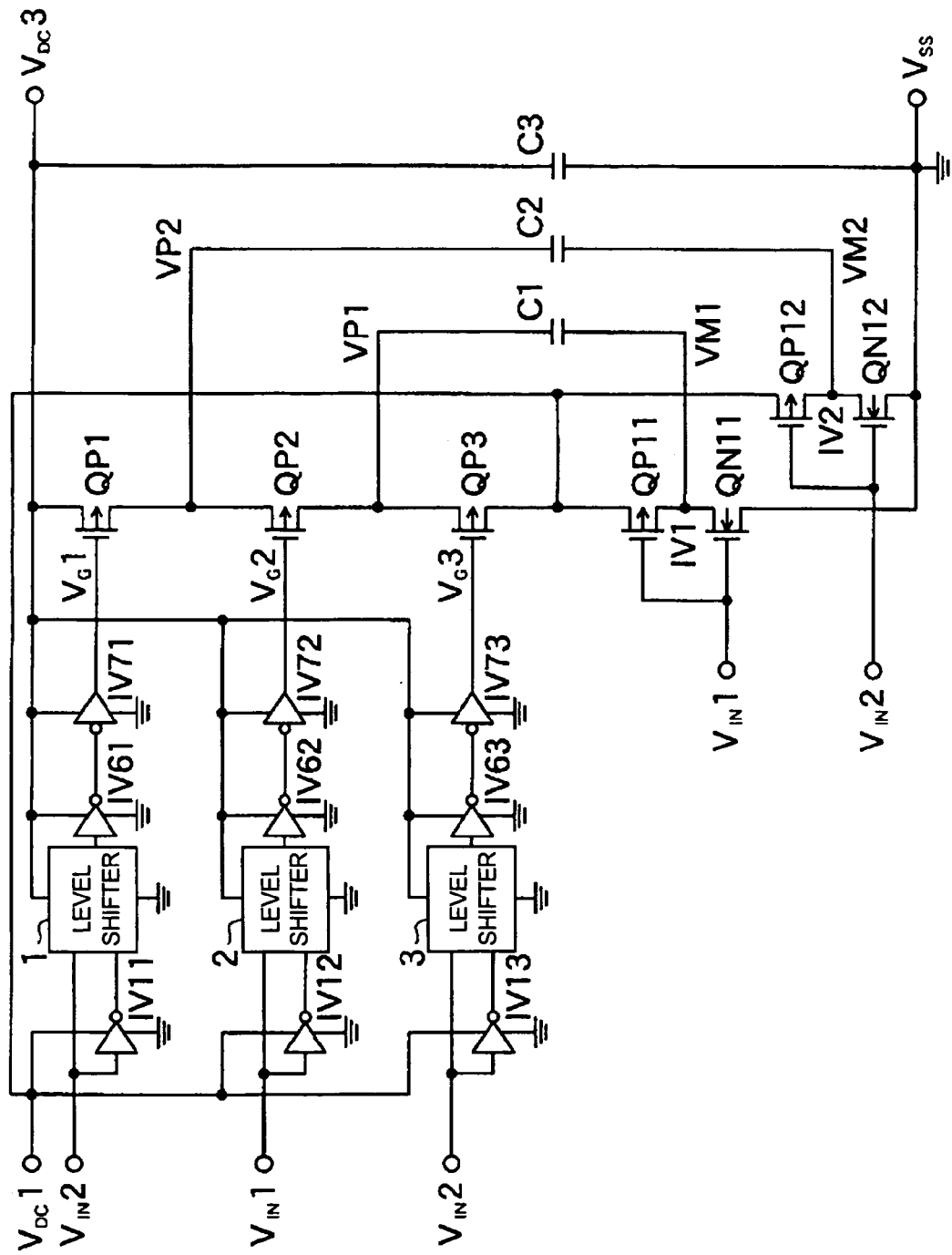
FIG. 6 is a diagram illustrating a configuration of a conventional boost circuit.
Figure 7:
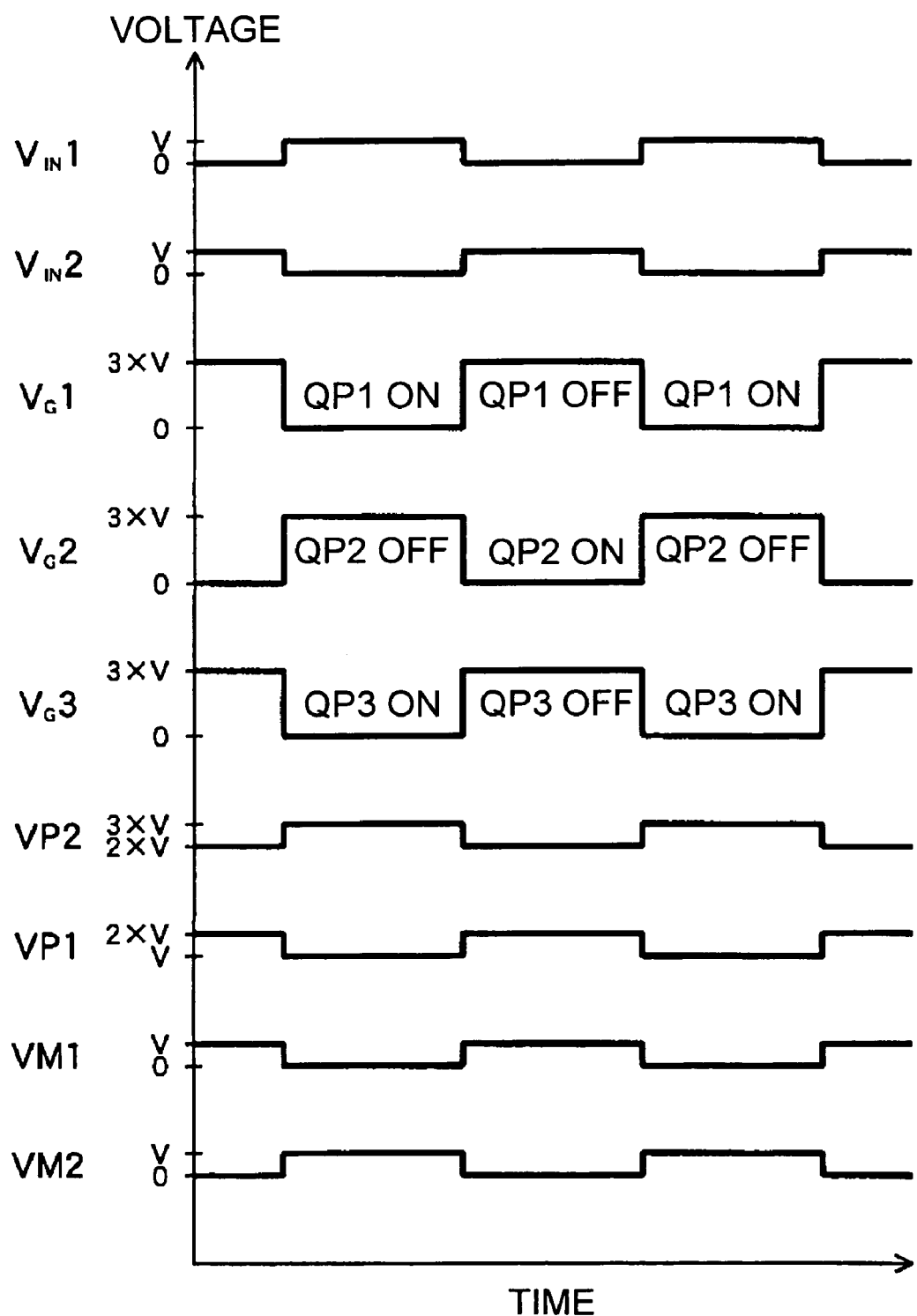
FIG. 7 is a diagram illustrating a waveform of each section of the conventional boost circuit.

According to the boost circuit of the present embodiment, it can reduce the substrate area to around one-eighth of the substrate area of the conventional boost circuit shown in FIG. 6. Because, with the TFT driver IC, the area of the boost circuit occupies about one-third of the substrate area of the entire power source circuit, the size of the chip can shrink with the present invention. Further, if the size of the transistor shrinks, the gate capacitance decreases, and, thereby, the charging and discharging current as well as the quiescent current decreases while improving the frequency feature of the boost clock signal and the boost efficiency. Moreover, because it is possible to lower the drive capacity of the inverters IV21 to IV52 for driving the transistors QP1 to QP4 that carry out the charge pump operation, this also enables the area of the substrate to shrink. In addition, in the present embodiment, the boost circuit that boosts the minus power source can also be realized if the P-channel MOS transistor is replaced with the N-channel MOS transistor and the N-channel transistor is replaced with the P-channel transistor.

Possibilities for Use in the Field

The present invention can be utilized as a boost circuit that employs the charge pump method, which is used as a power source circuit or the like of a TFT driver IC for driving a liquid crystal display.

What is claimed is:

1. A boost circuit for boosting a first power source potential using a clock signal that swings between the first power source potential and a reference potential, comprising:
    a first level shift means for shifting either a high level or a low level of the clock signal from the first power source potential to a second power source potential;
    a first boost means, which contains a plurality of transistors for conducting switching in accordance with the clock signal whose one level has been shifted by the first level shift means and a plurality of capacitors each coupled with the plurality of transistors, which generates the second source potential having an absolute value larger than that of the first power source potential by conducting a charge pump operation, and which supplies the second power source potential to the first level shift means;
    a second level shift means for shifting either a high level or a low level of the clock signal from the first power source potential to a third power source potential;
    a third level shift means for shifting the other level of the clock signal whose one level has been shifted by the second level shift means from the reference potential to the second power source potential; and
    a second boost means, which contains a plurality of transistors for conducting switching in accordance with the clock signal whose high level and low level have been shifted by the second and the third level shift means and a plurality of capacitors each coupled with the plurality of transistors, which generates the third power source potential having an absolute value larger than that of the second power source potential by conducting a charge pump operation, and which supplies the third power source potential to the second and third level shift means.

2. The boost circuit according to claim 1, wherein the first boost means includes:
    a first P-channel MOS transistor having a source or a drain coupled with the first power source potential;
    a second P-channel MOS transistor having a source or a drain coupled with a drain or a source of the first P-channel MOS transistor;
    a first inverter for inverting a first clock signal;
    a first capacitor coupled between a coupling node of the first and second P-channel MOS transistors and an output node of the first inverter; and
    a second capacitor coupled with the drain or the source of the second P-channel MOS transistor, holding the second power source potential.

3. The boost circuit according to claim 2, wherein the first level shift means includes:
    a first level shifter for generating a gate voltage of the first P-channel MOS transistor by shifting a high level of a second clock signal whose phase is a reversed phase of the first clock signal; and
    a second level shifter for generating a gate voltage of the second P-channel transistor by shifting a high level of the first clock signal.

4. The boost circuit according to claim 2, wherein the second boost means includes:
    a third P-channel transistor having a source or a drain coupled with the second power source potential;
    a fourth P-channel MOS transistor having a source or a drain coupled with a drain or a source of the third P-channel transistor;
    a second inverter for inverting the first clock signal;
    a third capacitor coupled between a coupling node of the third and fourth P-channel MOS transistors and the output node of the second inverter; and
    a fourth capacitor coupled with the drain or the source of the fourth P-channel MOS transistor, holding the third power source potential.

5. The boost circuit according to claim 4, wherein the second level shift means includes:
    a third level shifter for shifting a high level of the second clock signal; and a fourth level shifter for shifting a high level of the first clock signal; and the third level shift means contains:

a first slice circuit for generating a gate voltage of the third P-channel MOS transistor by shifting a low level of the second clock signal whose high level has been shifted by the third level shifter; and a second slice circuit for generating a gate voltage of the fourth P-channel MOS transistor by shifting the low level of the first clock signal whose high level has been shifted by the fourth level shifter.

6. A semiconductor integrated circuit realizing a boost circuit for boosting a first power source potential by using a clock signal that swings between the first power source potential and a reference potential, comprising:

a first level shift means for shifting either a high level or a low level of the clock signal from the first power source potential to a second power source potential;

a first boost means, which contains a plurality of transistors for conducting switching in accordance with the clock signal whose one level has been shifted by the first level shift means, which generates the second power source potential having an absolute value larger than that of the first power source potential by conducting a charge pump operation as a plurality of capacitors are coupled with the plurality of transistors, and which supplies the second power source potential to the first level shift means;

a second level shift means for shifting either a high level or a low level of the clock signal from the first power source potential to a third power source potential;

a third level shift means for shifting the other level the clock signal whose one level has been shifted by the second level shift means from the reference potential to the second power source potential; and a second boost means, which contains a plurality of transistors for conducting switching in accordance with the clock signal whose high level and low level have been shifted by the second and the third level shift means, which generates the third power source potential having an absolute value larger than that of the second power source potential by conducting a charge pump operation as a plurality of capacitors are coupled with the plurality of transistors, and which supplies the third power source potential to the second and the third level shift means.

* * * * *